(12) United States Patent
Chen et al.

(10) Patent No.: US 10,600,830 B2
(45) Date of Patent: Mar. 24, 2020

(54) SENSOR PACKAGE STRUCTURE

(71) Applicant: KINGPAK TECHNOLOGY INC., Hsin-Chu County (TW)

(72) Inventors: Jian-Ru Chen, Hsin-Chu County (TW); Jo-Wei Yang, Hsin-Chu County (TW); Li-Chun Hung, Hsin-Chu County (TW); Hsiu-Wen Tu, Hsin-Chu County (TW); Chung-Hsien Hsin, Hsin-Chu County (TW)

(73) Assignee: KINGPAK TECHNOLOGY INC., Hsin-Chu (TW)

( * ) Notice: Subject to any disclaimer, the term of this patent is extended or adjusted under 35 U.S.C. 154(b) by 21 days.

(21) Appl. No.: 15/819,741

(22) Filed: Nov. 21, 2017

(65) Prior Publication Data

US 2019/0057992 A1 Feb. 21, 2019

(30) Foreign Application Priority Data

Aug. 16, 2017 (CN) .......................... 2017 1 0700256

(51) Int. Cl.
*H01L 27/146* (2006.01)
*H01L 23/00* (2006.01)
*H01L 23/31* (2006.01)

(52) U.S. Cl.
CPC .. *H01L 27/14618* (2013.01); *H01L 27/14636* (2013.01); *H01L 23/315* (2013.01); *H01L 23/3128* (2013.01); *H01L 23/3135* (2013.01); *H01L 24/48* (2013.01); *H01L 24/49* (2013.01); *H01L 2224/48091* (2013.01); *H01L 2224/48108* (2013.01); *H01L 2224/48227* (2013.01); *H01L 2224/49171* (2013.01); *H01L 2224/49173* (2013.01); *H01L 2924/00014* (2013.01); *H01L 2924/15311* (2013.01)

(58) Field of Classification Search
CPC ..... H01L 23/3135; H01L 24/48; H01L 24/49; H01L 27/14618; H01L 27/14636
See application file for complete search history.

(56) References Cited

U.S. PATENT DOCUMENTS

| 2005/0063033 A1* | 3/2005 | Kinsman | ................. H01L 24/97 359/245 |
| 2009/0127690 A1* | 5/2009 | Jaducana | ............ B81C 1/00333 257/690 |
| 2016/0260761 A1 | 9/2016 | Jun | |

* cited by examiner

*Primary Examiner* — Matthew C Landau
*Assistant Examiner* — Mark Hatzilambrou
(74) *Attorney, Agent, or Firm* — Li & Cai Intellectual Property (USA) Office

(57) ABSTRACT

A sensor package structure includes a substrate, a sensor chip disposed on the substrate, a plurality of wires electrically connected to the substrate and the sensor chip, a transparent layer facing the sensor chip, a support disposed on the substrate, and a packaging compound disposed on the substrate and covering side edges of the support and the transparent layer. A part of each wire is embedded in the support. A height from the upper surface of the substrate to the top of the support is larger than a height from the upper surface of the substrate to the top of any of the wires. The bottom surface of the transparent layer has a central region facing the sensor chip and a ring-shaped supporting region surrounded by the central region. The support is arranged outside the sensor chip and abuts against the supporting region.

9 Claims, 11 Drawing Sheets

SENSOR PACKAGE STRUCTURE

BACKGROUND OF THE INVENTION

1. Field of the Invention

The present disclosure relates to a package structure; in particular, to a sensor package structure.

2. Description of Related Art

Electronic components inside a currently-available electronic device need to be researched and developed along the direction of having their sizes reduced, so that more electronic components can be installed within the limited space of the electronic device. However, development of existing sensor package structures (e.g., an image sensor package structure) has encountered the problem: none of the current sensor package structures is suitable for encapsulating sensor chips having much smaller sizes.

Considering the above flaws may be improvable, time is particularly spent, together with utilization of scientific principles, for studying the problem. Finally, the applicant proposed a design capable of effectively improving above disadvantages.

SUMMARY OF THE INVENTION

The present disclosure provides a sensor package structure, by the disclosed architecture distinguished from prior arts, to effectively improve the drawbacks easily incurred by the current sensor package structures.

The present disclosure discloses a sensor package structure, which includes a substrate, a sensor chip, a plurality of wires, a transparent layer, a support, and a packaging compound. The substrate has an upper surface and an opposing lower surface. The substrate includes a plurality of solder pads arranged on the upper surface. The sensor chip has a top surface and an opposing bottom surface. The bottom surface of the sensor chip is disposed on the upper surface of the substrate and surrounded by the solder pads. The sensor chip includes a plurality of connecting pads arranged on the top surface. The terminals on one end of the wires are respectively connected to the solder pads, and the terminals on the other end of the wires are respectively connected to the connecting pads. The transparent layer has a first surface and a second surface opposing to the first surface. The second surface has a central region facing the sensor chip and a ring-shaped supporting region arranged around the central region. The support is disposed on the upper surface of the substrate and is arranged outside the sensor chip. A top side of the support abuts against the supporting region of the transparent layer. A part of each of the wires is embedded in the support, and a height from the upper surface of the substrate to the top of the support is larger than a height from the upper surface of the substrate to the top of any of the wires. The packaging compound is disposed on the upper surface of the substrate and covers a side edge of the support and a side edge of the transparent layer.

In summary, within the sensor package structure disclosed in the present disclosure, the relative position between the transparent layer and the sensor chip can be maintained by the support. Thus, it does not need to dispose an additional supporting structure on the top surface of the sensor chip, which further benefits incorporating the sensor chip into the sensor package structure which have been downsized.

In order to further appreciate the characteristics and technical contents of the present disclosure, references are hereunder made to the detailed descriptions and appended drawings in connection with the present disclosure. However, the appended drawings are merely shown for exemplary purposes, and should not be construed as restricting the scope of the present disclosure.

DETAILED DESCRIPTION OF THE PREFERRED EMBODIMENTS

Figure 1:
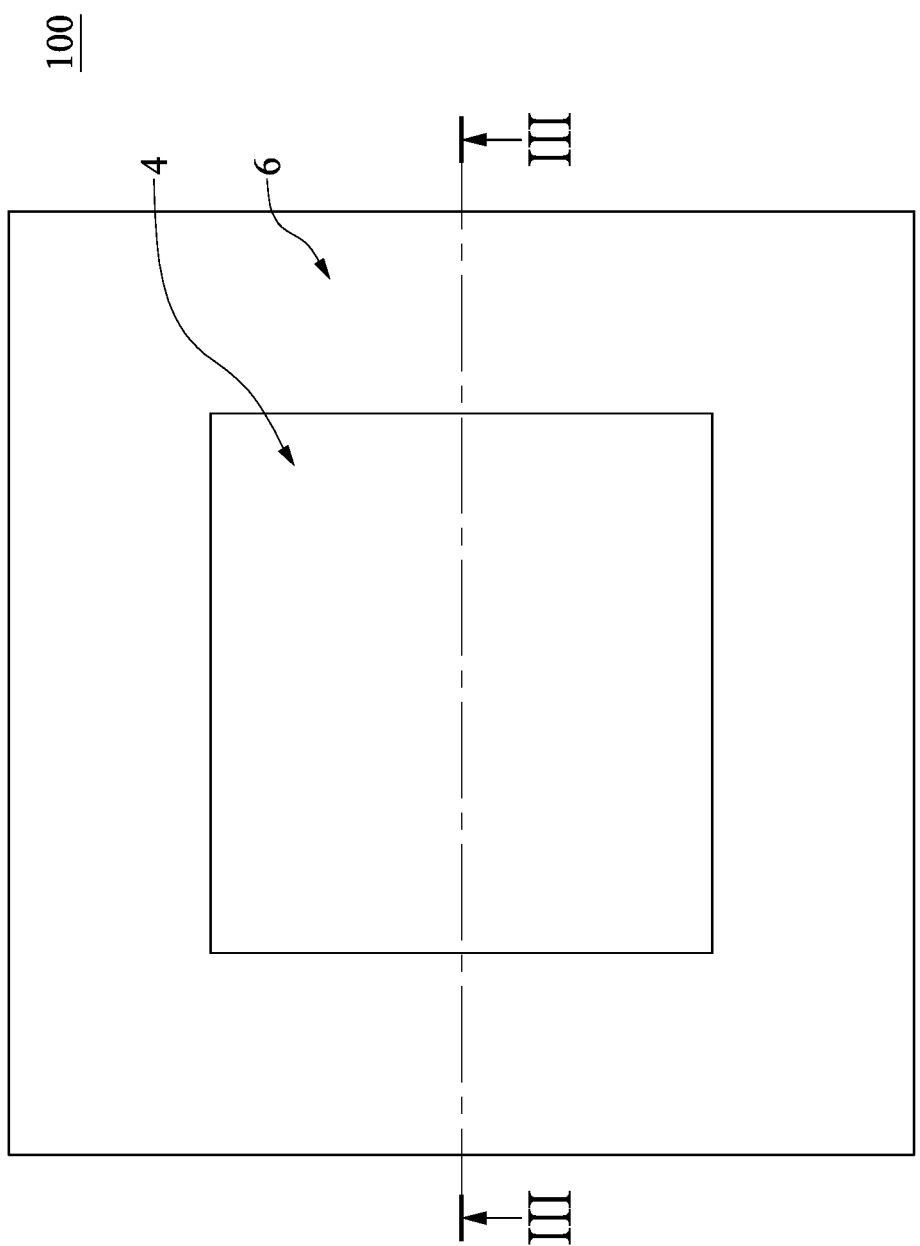
FIG. 1 is a top planar view showing a sensor package structure according to a first embodiment of the present disclosure.

Reference is made to FIGS. 1 to 11, which illustrate the present disclosure. References are hereunder made to the detailed descriptions and appended drawings in connection with the present disclosure. However, the appended drawings are merely provided for exemplary purposes, and should not be construed as restricting the scope of the present disclosure.

First Embodiment

As illustrated in FIGS. 1 to 5, the present embodiment discloses a sensor package structure 100, particularly an image sensor package structure 100, but the present disclosure is not limited thereto. The sensor package structure 100 includes a substrate 1, a sensor chip 2 disposed on the substrate 1, a plurality of wires 3 electrically connecting the substrate 1 and the sensor chip 2, a transparent layer 4 at a position corresponding to the sensor chip 2, a support 5 disposed on the substrate 1 for maintaining the relative position between the transparent layer 4 and the sensor chip 2, and a packaging compound 6 disposed on the substrate 1 and covering the support 5 and the transparent layer 4. In the following description, the structure of each component of the sensor package structure 100 is elaborated. Interconnection of the components shall be recited as well.

Figure 2:
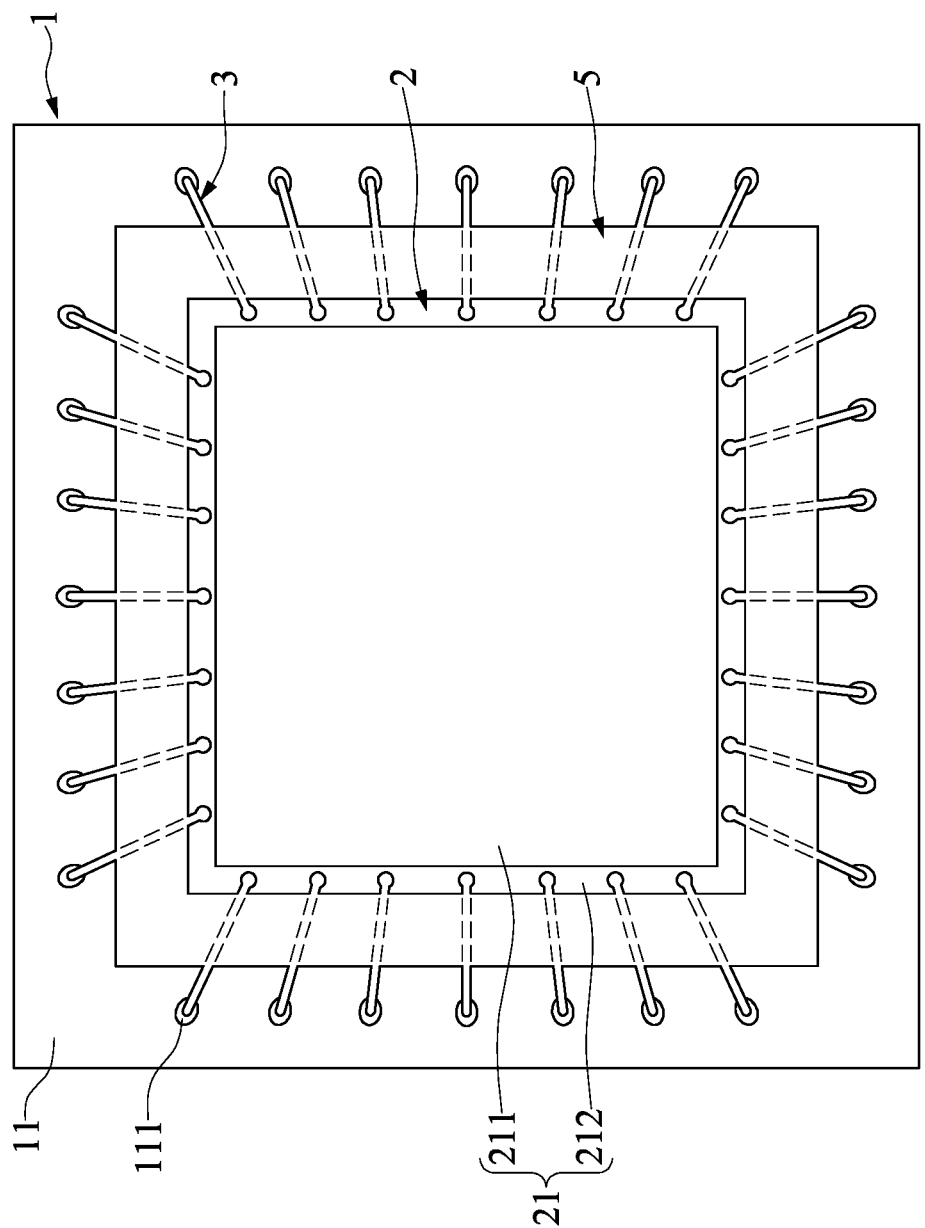
FIG. 2 is a simplified diagram of FIG. 1, in which the transparent layer and the packaging compound have been omitted.
Figure 3:
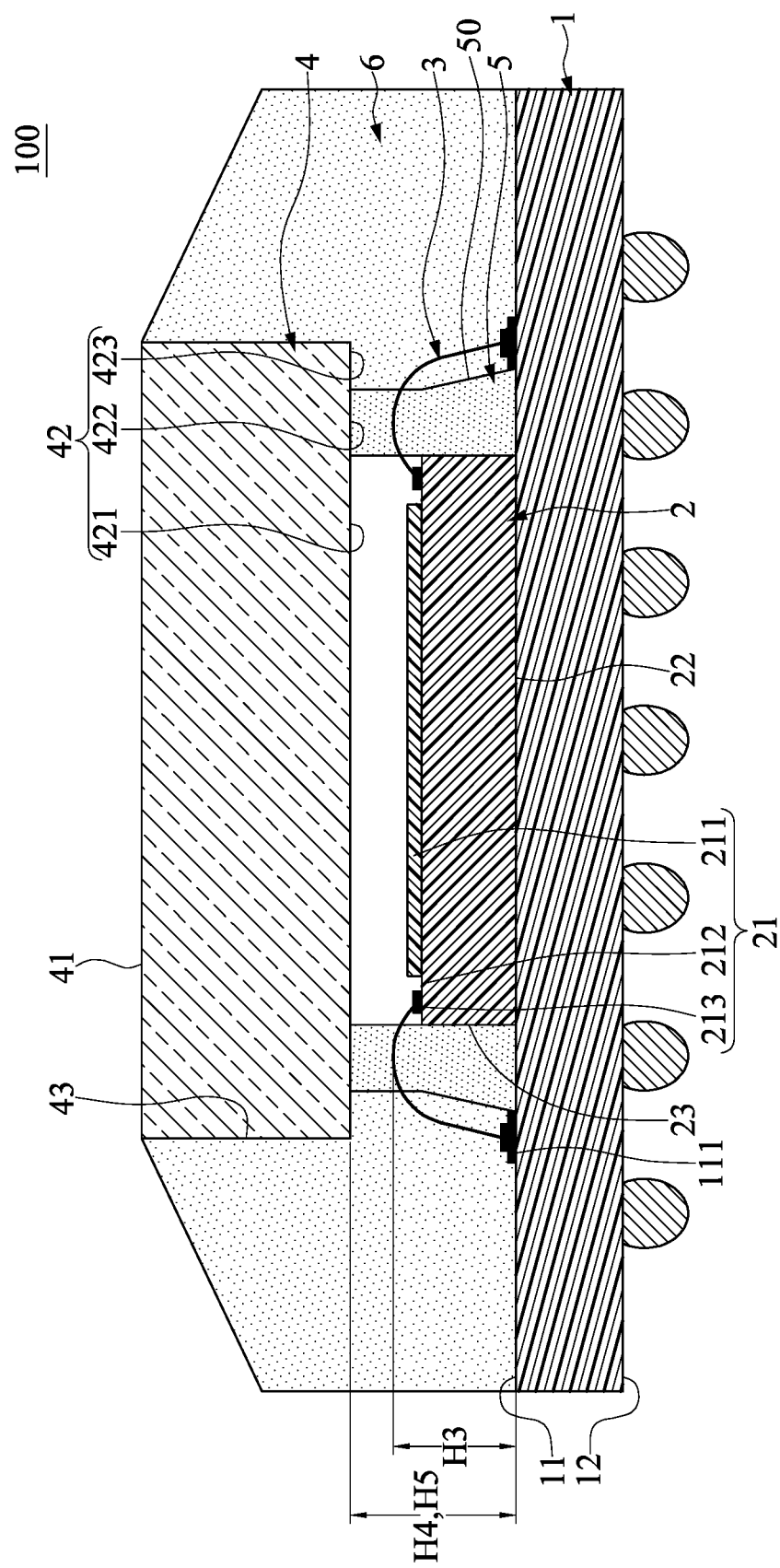
FIG. 3 is a cross-sectional view taken along a cross-sectional line III-III of FIG. 1.

As shown in FIGS. 2 and 3, the substrate 1 may be a plastic substrate, a ceramic substrate, a lead frame, or other laminated materials, and the present disclosure is not limited thereto. The substrate 1 has an upper surface 11 and a lower surface 12 opposing to the upper surface 11. The substrate 1 includes a plurality of solder pads 111 arranged on the upper surface 11 and spaced apart from each other. Furthermore, the substrate 11 also includes a plurality of solder pads (not labeled) arranged on the lower surface 12 for respectively connecting a plurality of solder balls (not labeled). In other words, the substrate 1 is illustrated by considering it as a ball grid array (BGA) structure, but the present disclosure is not limited thereto.

As shown in FIGS. 2 and 3, the sensor chip 2 in the present embodiment is an image sensor chip 2, but the type of the sensor chip 2 of the present disclosure is not limited thereto. The sensor chip 2 has a top surface 21, a bottom surface 22 opposing to the top surface 21, and a side edge 23 perpendicularly connected to the top surface 21 and the bottom surface 22. The top surface 21 of the sensor chip 2 has a sensing region 211 and a ring-shaped wiring region 212 arranged around the sensing region 211. The sensor chip 2 includes a plurality of connecting pads 213 arranged on the wiring region 212.

Specifically, the sensing region 211 in the present embodiment is roughly rectangular (e.g., a square or a rectangle). The center of the sensing region 211 may be identical to (as shown in FIG. 2) or deviate from (not shown) that of the top surface 21. The wiring region 212 in the present embodiment is a rectangular ring shape, and preferably each portion of the wiring region 212 has the same width. However, the shape of the wiring region 212 of the present disclosure may be modified according to the designer's or manufacturer's need and is not limited thereto. Moreover, an area of the sensing region 211 in the present embodiment substantially takes 60~95% (preferably 80~90%) of an area of the top surface 21 of the sensor chip 2. In other words, the area of the wiring region 212 of the sensor chip 2 is downsized to reduce the size of the sensor chip 2.

In another aspect, the bottom surface 22 of the sensor chip 2 is disposed on the upper surface 11 of the substrate 1 and is surrounded by the solder pads 111. That is to say, the portion of the upper surface 11 of the substrate 1 for carrying the sensor chip 2 substantially locates within a region surrounded by the solder pads 111. The bottom surface 22 of the sensor chip 2 in the present embodiment is fixed on the upper surface 11 of the substrate 1 by an adhesive (die attach epoxy, not labeled), but the actual implementation is not limited thereto.

As shown in FIGS. 2 and 3, the terminals on one end of the wires 3 are respectively connected to the solder pads 111 of the substrate 1, and the terminals on the other end of the wires 3 are respectively connected to the connecting pads 213 of the sensor chip 2. Each of the wires 3 may be formed by using a reverse bond manner or a forward bond manner. Specifically, when each of the wires 3 is formed by using the reverse bond manner, between the top surface 21 of the sensor chip 2 and an adjacent portion of each of the wires 3 is an angle (not labeled) smaller than or equal to 45 degrees, so that the apex of each of the wires 3 is at a lower level and thus prevented from touching the transparent layer 4, but the present disclosure is not limited thereto. For example, alternatively, the angle may be smaller than or equal to 30 degrees.

As shown in FIGS. 2 and 3, the transparent layer 4 in the present embodiment is transparent and elaborated by assuming it is a glass plate, but the transparent layer 4 of the present disclosure is not limited thereto. For example, the transparent layer 4 can be made of a light-transmissive (or transparent) plastic material. The transparent layer 4 has a first surface 41, a second surface 42 opposing to the first surface 41, and a side edge 43 perpendicularly connected to the first surface 41 and the second surface 42. The first surface 41 and the second surface 42 in the present embodiment are rectangular shapes (a square or a rectangle) having the same size, and an area of the second surface 42 is larger than that of the top surface 21 of the sensor chip 2, but the present disclosure is not limited thereto.

Furthermore, the transparent layer 4 is arranged above the sensor chip 2 by using the support 5, and the second surface 42 of the transparent layer 4 is substantially parallel to and faces the top surface 21 of the sensor chip 2. Moreover, the second surface 42 has a central region 421 facing the sensor chip 2, a ring-shaped supporting region 422 enclosing the central region 421, and a ring-shaped fixing region 423 surrounding the supporting region 422. The projecting region (not labeled), formed by orthogonally projecting the sensing region 211 of the sensor chip 2 onto the second surface 42, serves as the central region 421 of the second surface 42. Of the second surface 42, the portion abutting upon the support 5 is just the supporting region 422. The rest portion beyond the central region 421 and the supporting region 422 is the fixing region 423.

In addition, the second surface 42 of the transparent layer 4 is preferably arranged close to but does not contact with each of the wires 3. As shown in FIG. 3, a height H3 from the upper surface 11 of the substrate 1 to the apex of each of the wires 3 is preferably smaller than a height H4 from the upper surface 11 of the substrate 1 to the second surface 42 of the transparent layer 4, but the present disclosure is not limited thereto.

It should be noted that the transparent layer 4 in the present embodiment is a glass plate, but the structure of the transparent layer 4 may be altered according to a designer's demand. For example, in other embodiments not depicted by the present disclosure, the transparent layer 4 may have a stepped portion formed on the periphery of the top portion thereof, for the packaging compound 6 to adhere to the stepped portion.

As shown in FIGS. 2 and 3, the support 5 has a ring shape and is made of a glass mount epoxy (GME), but the present disclosure is not limited thereto. A bottom side of the support 5 is disposed on the upper surface 11 of the substrate 1, located outside the sensor chip 2, and surrounded by the solder pads 111 of the substrate 1. The support 5 preferably does not contact with the top surface 21 of the sensor chip 2. A top side of the support 5 abuts against the supporting region 422 of the transparent layer 4, that is to say, the support 5 does not contact with the central region 421 or the fixing region 423 of the transparent layer 4.

Figure 4:
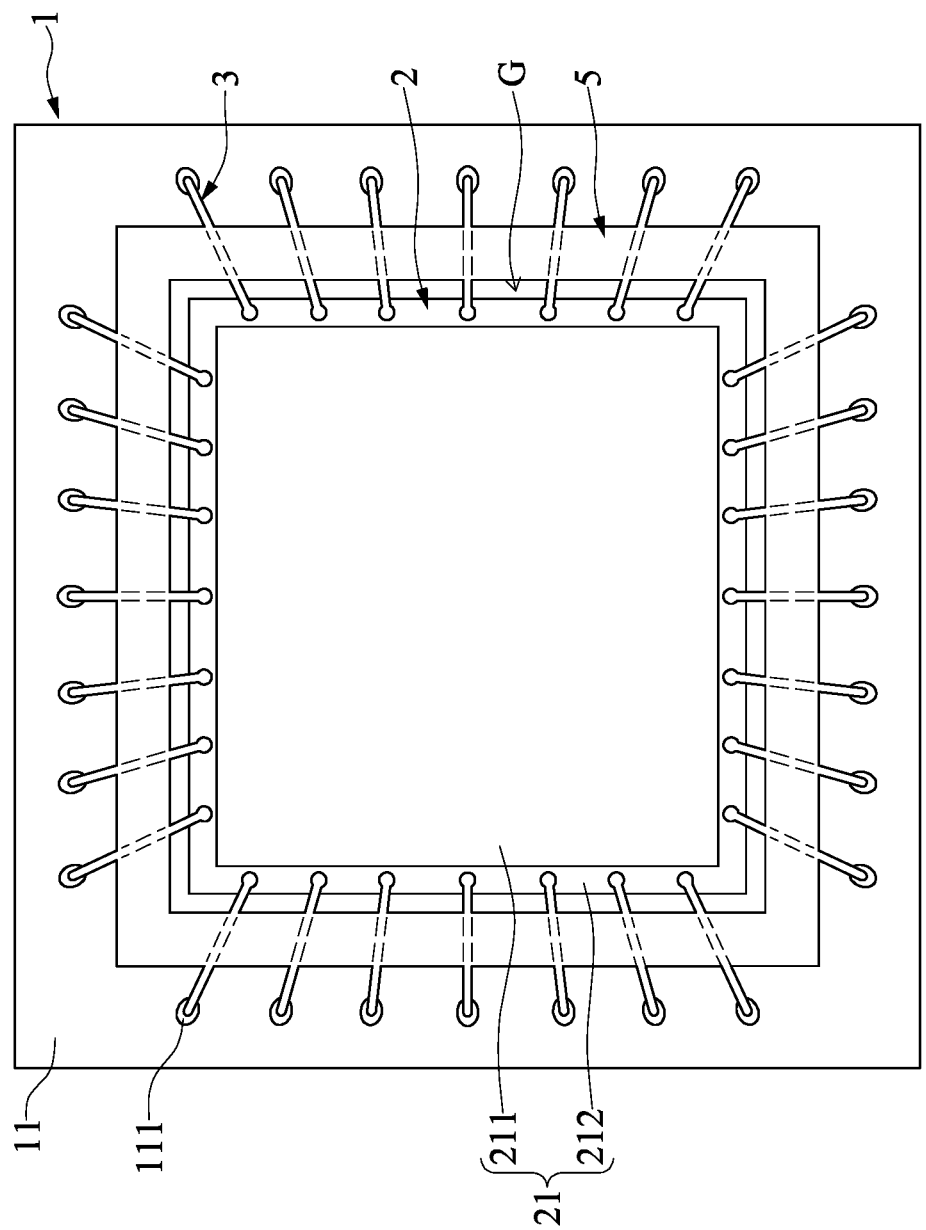
FIG. 4 is a top planar view of a slightly modified sensor package structure according to the first embodiment, in which the transparent layer and the packaging compound have been omitted.
Figure 5:
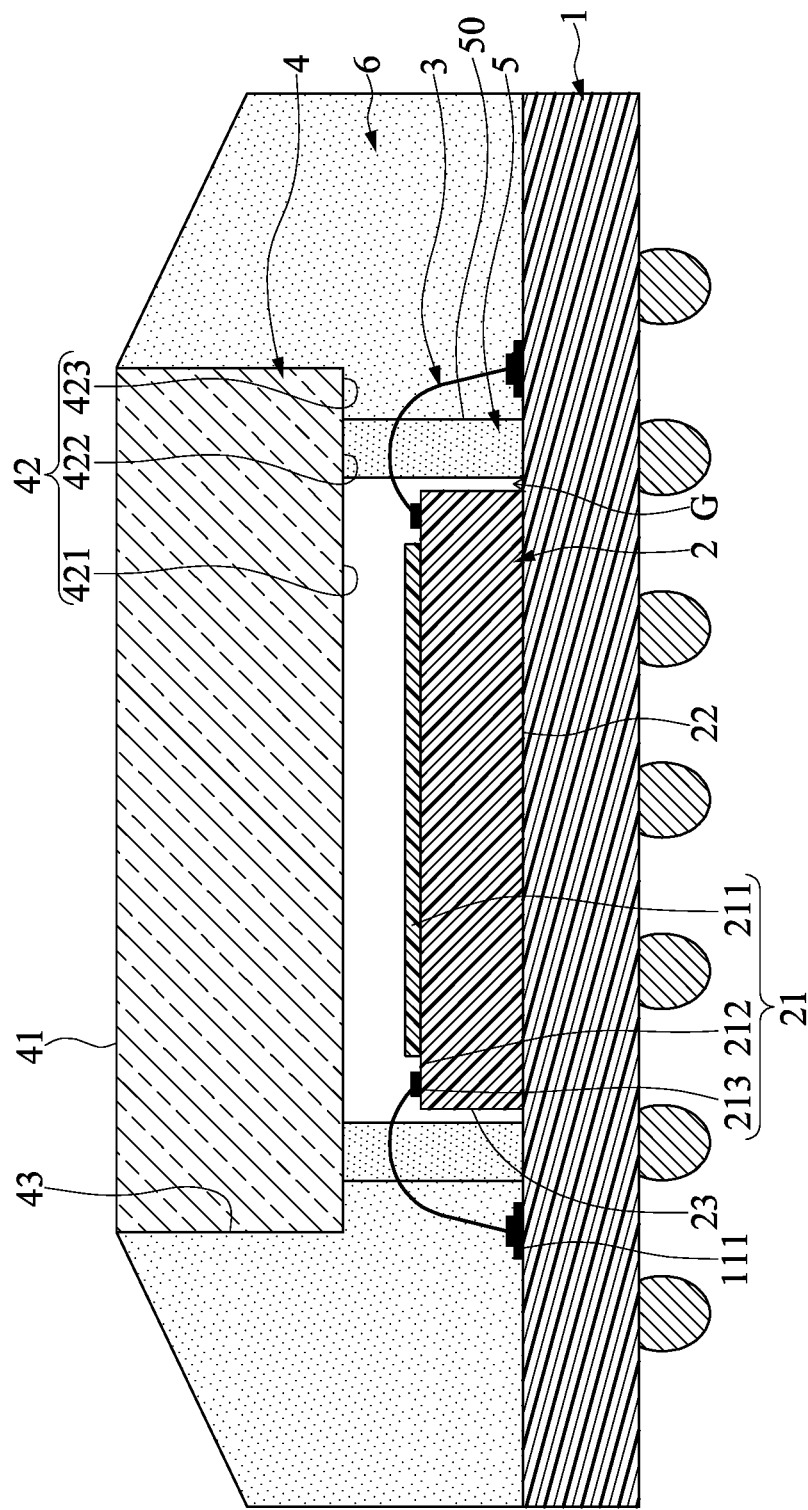
FIG. 5 is a cross-sectional view showing the sensor package structure as shown in FIG. 4.

Each of the wires 3 is partially embedded in the support 5, and a height H5 from the upper surface 11 of the substrate 1 to the top surface of the support 5 is larger than the height H3 from the upper surface 11 of the substrate 1 to the top of any of the wires 3. The height H5 in the present embodiment is substantially equal to the height H4. In addition, the support 5 covers at least a part of the side edge 23 of the sensor chip 2, but the present disclosure is not limited thereto. For example, as shown in FIGS. 4 and 5, the support 5 and the side edge 23 of the sensor chip 2 may be provided with a gap G therebetween.

As shown in FIGS. 2 and 3, the packaging compound 6 is disposed on the upper surface 11 of the substrate 1 and covers the side edge 50 of the support 5, the fixing region 423, and the side edge 43. A part of each of the wires 3 (i.e., the part of each wire 3 neighboring with the side edge 50 of the support 5) and each of the solder pads 111 are embedded in the packaging compound 6.

In summary, the sensor package structure 100 in the present embodiment is provided with the support 5 to maintain the relative position between the transparent layer 4 and the sensor chip 2, so it does not need to set up an extra supporting structure on the top surface 21 of the sensor chip 2, which facilitates putting the sensor chip 2 into the sensor package structure 100 having been downsized. Specifically, compared to the prior art, the area of the sensor package structure 100 for forming the wiring region 212 is decreased (e.g., the sensing region 211 shall occupy 60~95% of the total area of the top surface 21), the sensor chip 2 can be installed into the sensor package structure 100 more easily.

Second Embodiment

Figure 6:
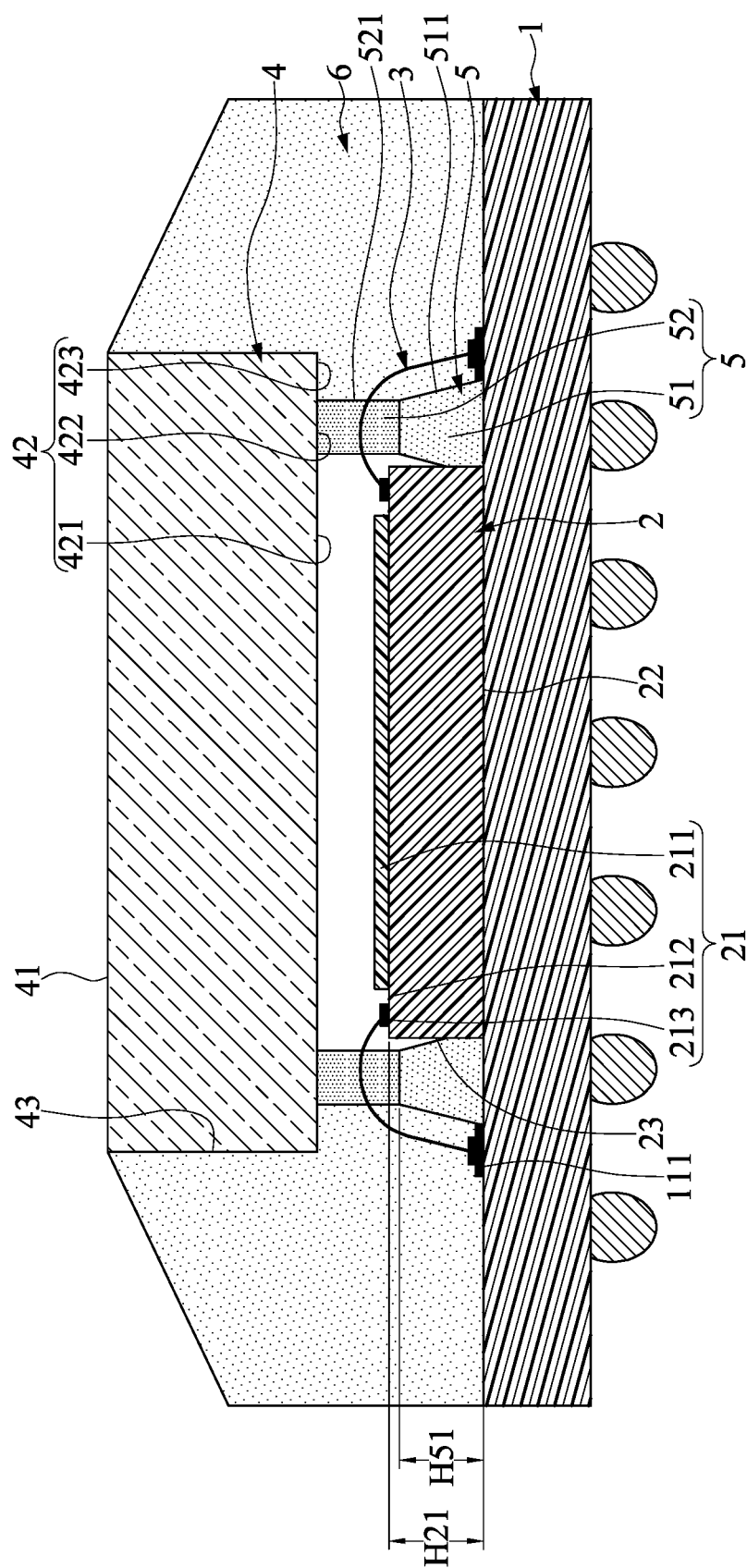
FIG. 6 is a cross-sectional view showing a sensor package structure according to a second embodiment of the present disclosure.
Figure 7:
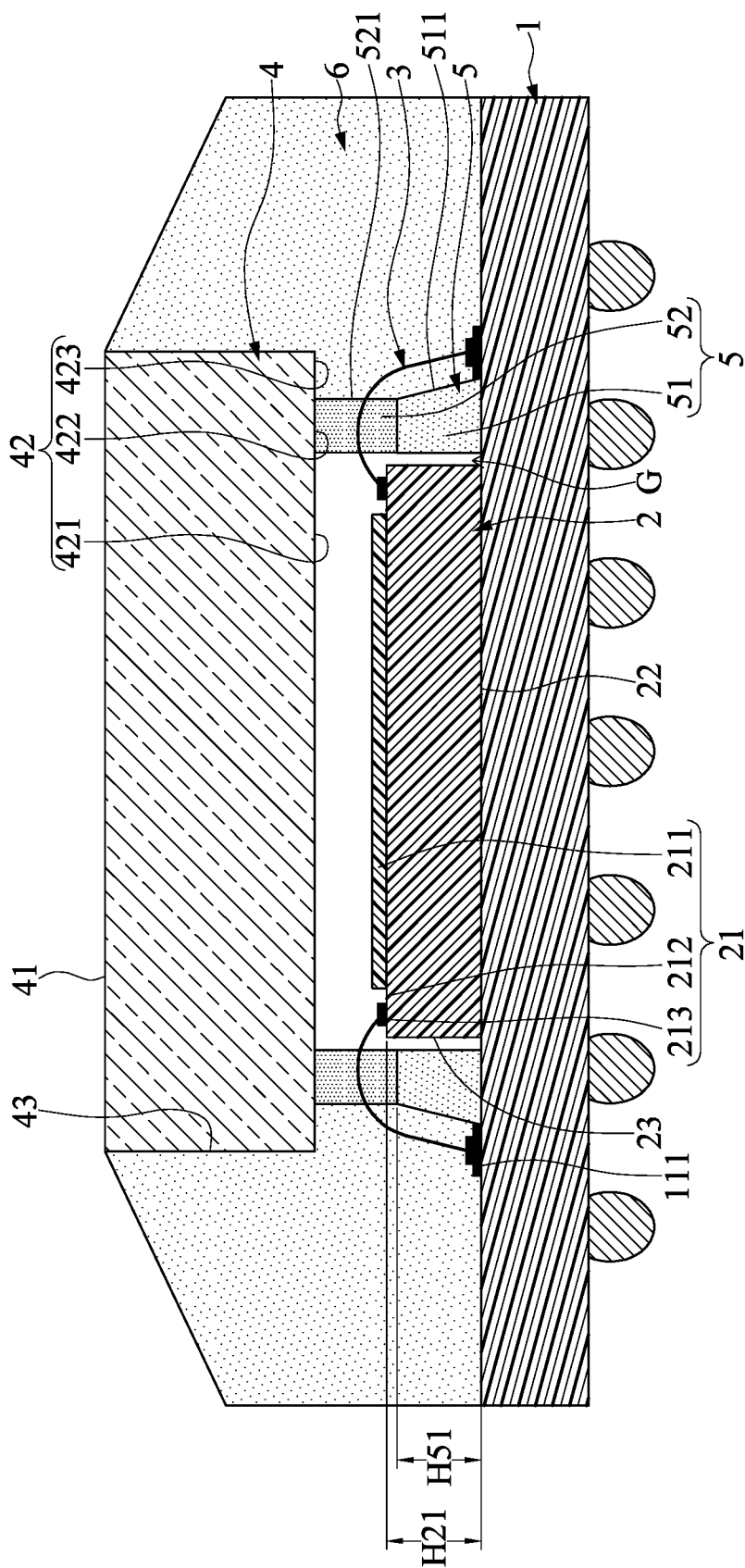
FIG. 7 is a cross-sectional view showing a slightly modified sensor package structure according to the second embodiment of the present disclosure.

Reference is made to FIGS. 6 and 7, which illustrate a second embodiment of the present disclosure. The second embodiment is similar to the first embodiment, the main difference between the two embodiments is the support 5, and the specific difference between the two embodiments is disclosed as follows.

The support 5 in the present embodiment includes a supporting layer 51 and a combining layer 52 disposed on the supporting layer 51. A top side of the combining layer 52 abuts against the supporting region 422 of the transparent layer 4. In other words, the present disclosure does not limit the type of the support 5. The support 5 may be a single piece made of the same material (i.e., the first embodiment) or a complex piece consisting of a plurality of materials (i.e., the present embodiment).

Moreover, the supporting layer 51 and the combining layer 52 have a ring shape and overlap with each other. The supporting layer 51 and the combining layer 52 may be made of the same material (such as GME) or different materials. The supporting layer 51 is disposed on the upper surface 11 of the substrate 1 and arranged between the sensor chip 2 and the solder pads 111. A height H 51 from the upper surface 11 of the substrate 1 to the top of the supporting layer 51 is preferably not larger than (e.g., smaller than) a height H21 from the upper surface 11 of the substrate 1 to the top surface 21 of the sensor chip 2. Accordingly, the supporting layer 51 preferably does not contact with each of the wires 3, but the present disclosure is not limited thereto.

Specifically, as shown in FIG. 6, the supporting layer 51 covers at least a part of the side edge 23 of the sensor chip 2, but the present disclosure is not limited thereto. For example, as shown in FIG. 7, the supporting layer 51 and the side edge 23 of the sensor chip 2 may be provided with a gap G therebetween.

Moreover, the combining layer 52 is arranged between the supporting layer 51 and the supporting region 422 of the transparent layer 4, and the combining layer 52 preferably does not contact with the upper surface 11 of the substrate 1, any of the solder pads 111, or any of the connecting pads 213. Each of the wires 3 is partially embedded in the combining layer 52. Specifically, each of the supporting layer 51 and the combining layer 52 in the present embodiment is formed through a separate step so as to build the support 5. The supporting layer 51 is the lower half portion of the support 5, the combining layer 52 is the upper half portion of the support 5, and the thickness of the combining layer 52 is not smaller than that of the supporting layer 51, but the present disclosure is not limited thereto.

In addition, the packaging compound 6 is disposed on the upper surface 11 of the substrate 1 and covers the side edge 511 of the supporting layer 51, the side edge 521 of the combining layer 52, the fixing region 423, and the side edge 43. A part of each of the wires 3 (i.e., the part of each wire 3 neighboring with the side edge 521 of the supporting layer 51 and the side edge 521 of the combining layer 52) and each of the solder pads 111 are embedded in the packaging compound 6.

Third Embodiment

Figure 8:
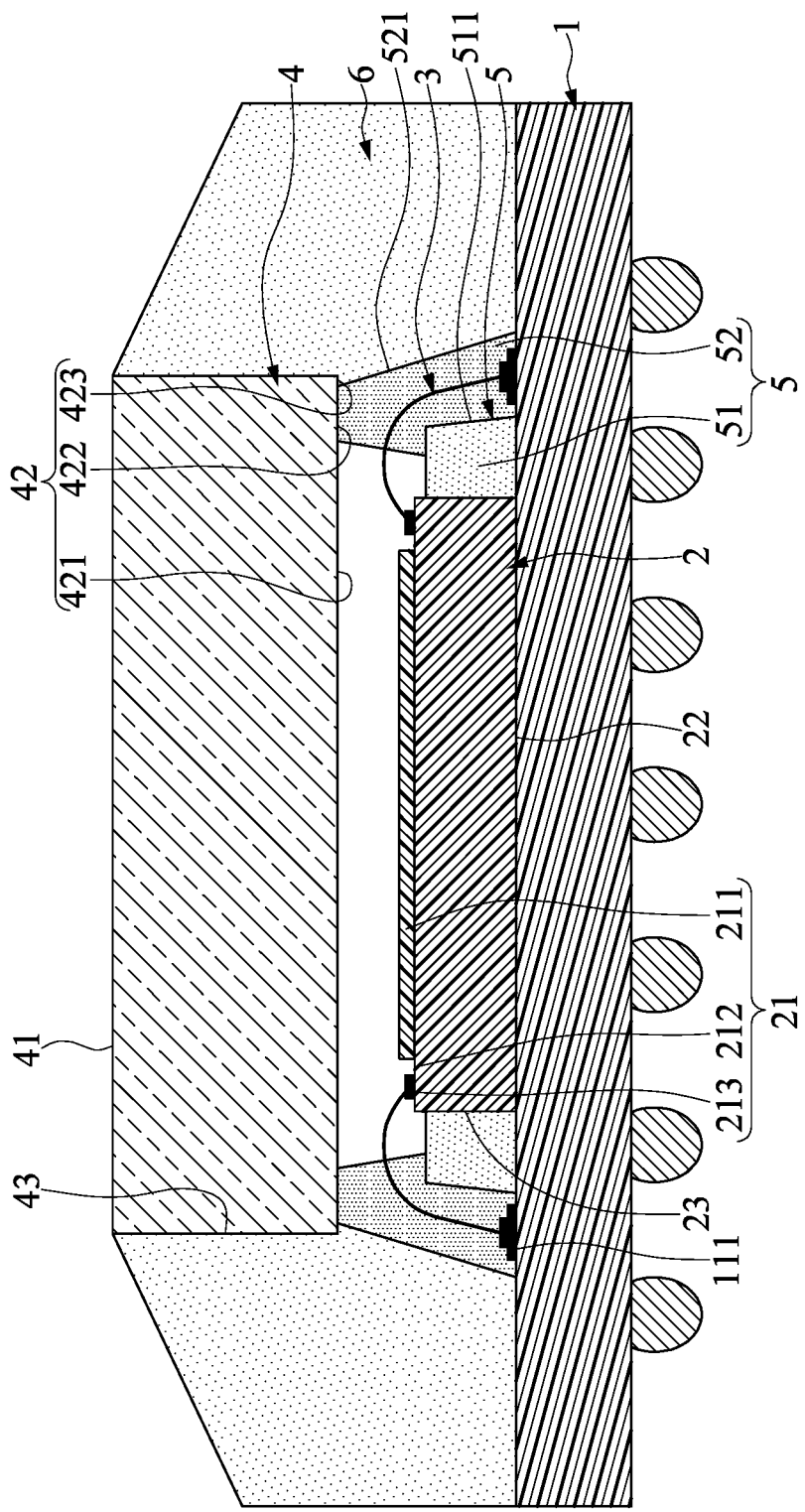
FIG. 8 is a cross-sectional view showing a sensor package structure according to a third embodiment of the present disclosure.

Reference is made to FIG. 8, which illustrates a third embodiment of the present disclosure. The third embodiment is similar to the second embodiment, the main difference between the two embodiments is the combining layer 52, and the specific difference between the two embodiments is disclosed as follows.

The combining layer 52 covers the side edge 511 and a part of the top side of the supporting layer 51, and the bottom side of the combining layer 52 is disposed on the upper surface 11 of the substrate 1. The solder pads 111 are embedded in the combining layer 52. Moreover, a part of each of the wires 3, which is adjacent to the corresponding solder pad 111, is embedded in the combining layer 52. That is to say, the supporting layer 51 is approximately arranged between the sensor chip 2 and the combining layer 52.

In addition, the packaging compound 6 is disposed on the upper surface 11 of the substrate 1 and covers the side edge 521 of the combining layer 52, the fixing region 423, and the side edge 43. The wires 3 and the solder pads 111 do not contact with the packaging compound 6. That is to say, the wires 3 and the solder pads 111 are enclosed by the packaging compound 6.

Fourth Embodiment

Figure 9:
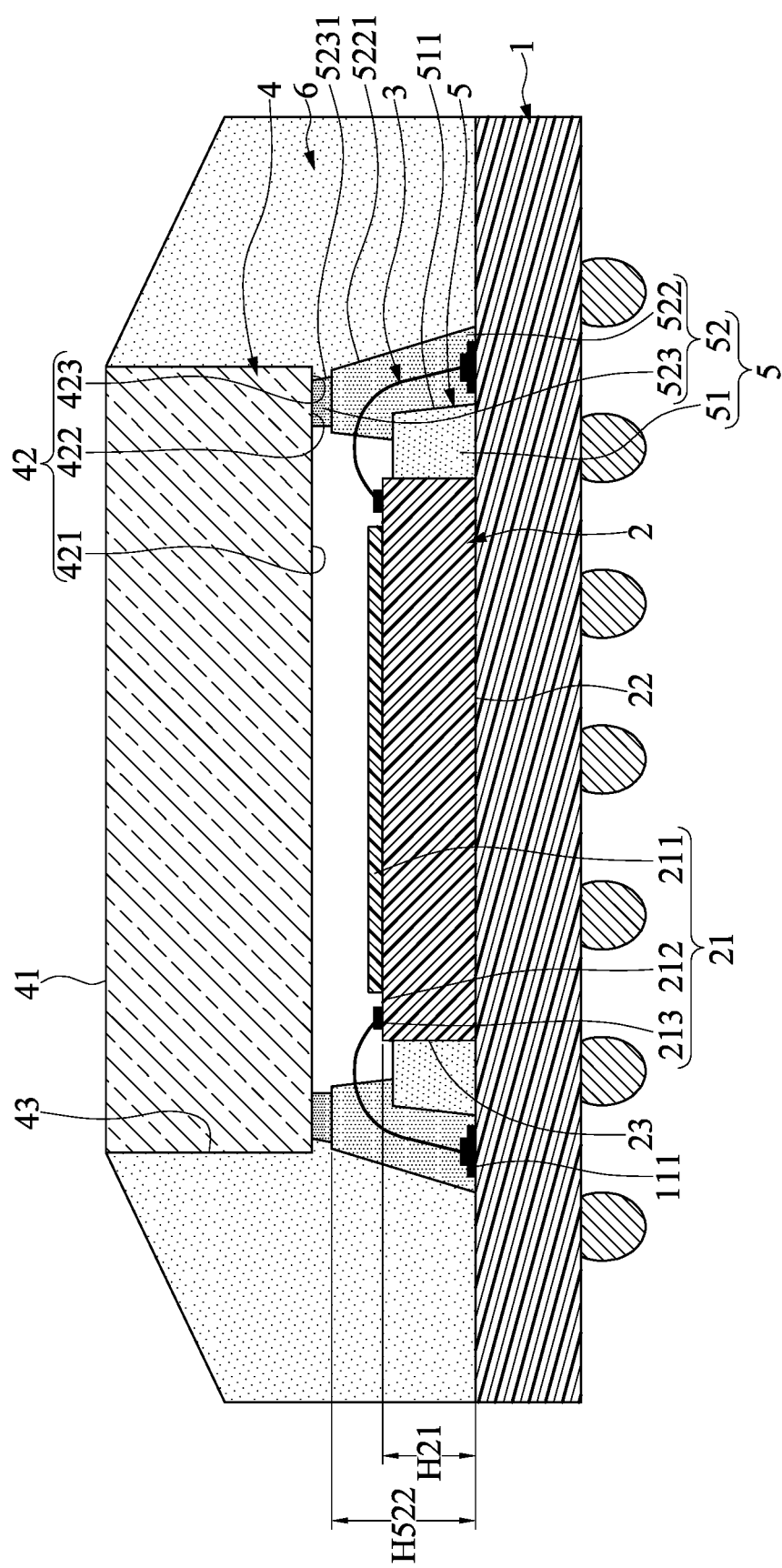
FIG. 9 is a cross-sectional view showing a sensor package structure according to a fourth embodiment of the present disclosure.

Reference is made to FIG. 9, which illustrates a fourth embodiment of the present disclosure. The fourth embodiment is similar to the third embodiment, the main difference between the two embodiments is the combining layer 52, and the specific difference between the two embodiments is disclosed as follows.

The combining layer 52 includes a first layer 522 and a second layer 523 disposed on the first layer 522. The first layer 522 has a ring shape and is disposed on the supporting layer 51 (e.g., the first layer 522 covers the side edge 511 and a part of the top side of the supporting layer 51), and the bottom side of the first layer 522 is disposed on the upper surface 11 of the substrate 1. The solder pads 111 are embedded in the first layer 522. Moreover, a part of each of the wires 3, which is adjacent to the corresponding solder pad 111, is embedded in the first layer 522. That is to say, the supporting layer 51 is approximately arranged between the sensor chip 2 and the first layer 522. Specifically, a height H522 from the upper surface 11 of the substrate 1 to the top of the first layer 522 is larger than a height H21 from the upper surface 11 of the substrate 1 to the top surface 21 of the sensor chip 2.

The second layer 523 has a ring shape and is disposed on the first layer 522, and a top side of the second layer 523 abuts against the supporting region 422 of the transparent layer 4. In addition, the thickness of the second layer 523 is smaller than that of the first layer 522, and the bottom side of the second layer 523 is just disposed on a part of the top side of the first layer 522, but the present disclosure is not limited thereto.

Fifth Embodiment

Figure 10:
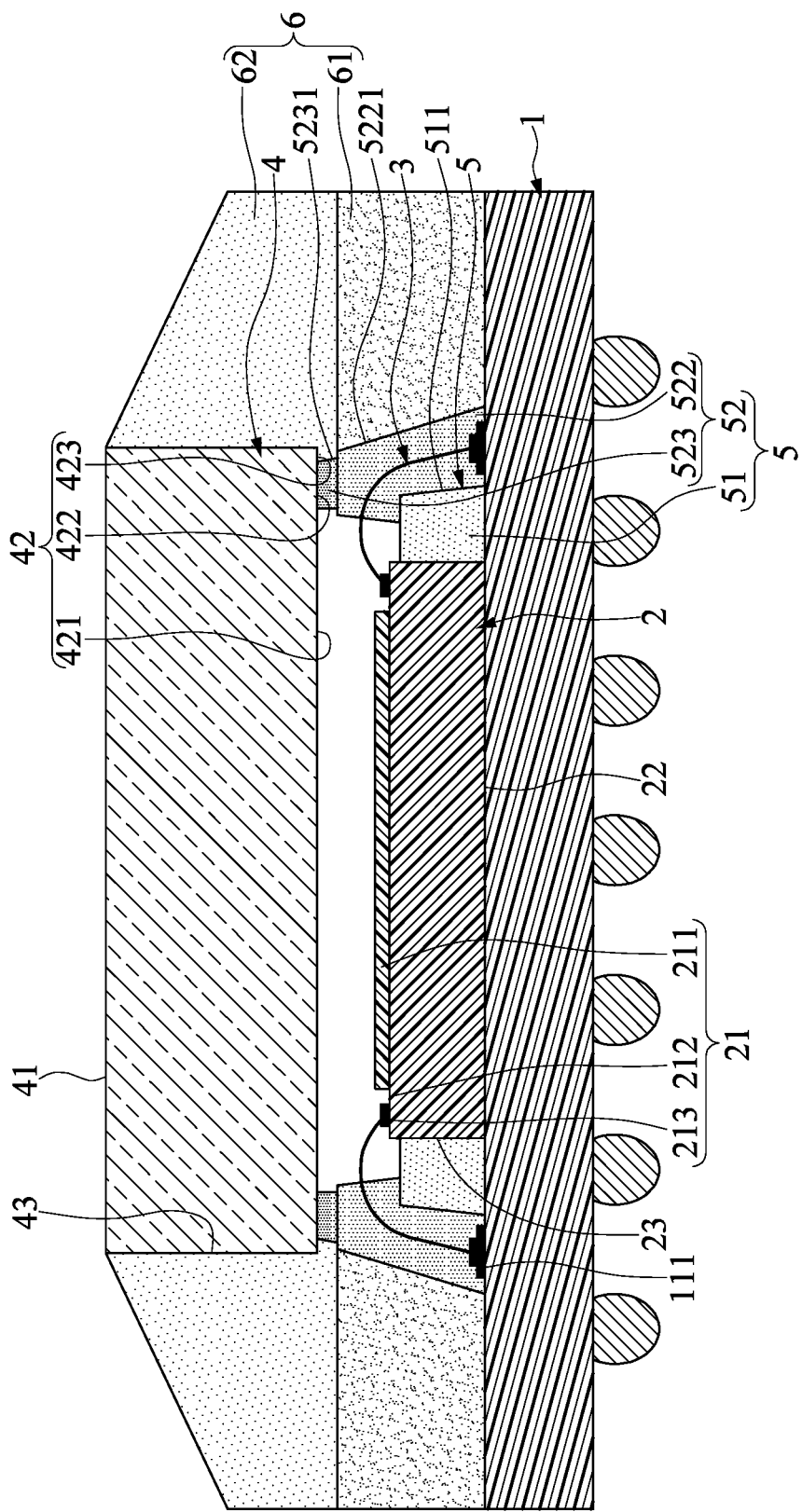
FIG. 10 is a cross-sectional view showing a sensor package structure according to a fifth embodiment of the present disclosure.

Reference is made to FIG. 10, which illustrates a fifth embodiment of the present disclosure. The fifth embodiment is similar to the fourth embodiment, the main difference between the two embodiments is the packaging compound 6, and the specific difference between the two embodiments is disclosed as follows.

The packaging compound 6 includes a molding compound 61 and a liquid compound 62. The molding compound 61 is disposed on the upper surface 11 of the substrate 1 and covers the side edge 5221 of the first layer 522. The top side of the molding compound 61 is preferably flush with that of the first layer 522. The liquid compound 62 is disposed on the molding compound 61 and covers the side edge 5231 of the second layer 523, the fixing region 423, and the side edge 43 of the transparent layer 4.

Sixth Embodiment

Figure 11:
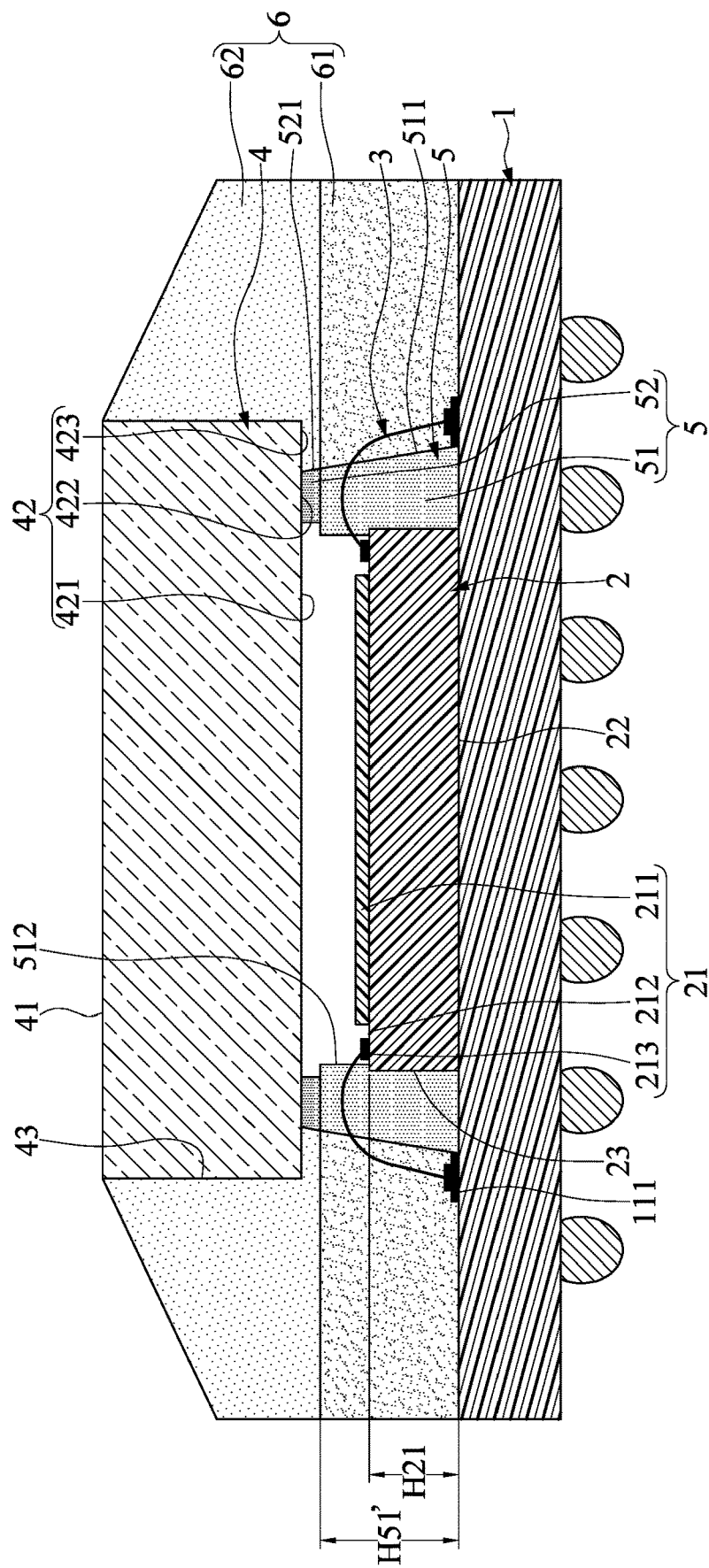
FIG. 11 is a cross-sectional view showing a sensor package structure according to a sixth embodiment of the present disclosure.

Reference is made to FIG. 11, which illustrates a sixth embodiment of the present disclosure. The sixth embodiment is similar to the second embodiment, the main difference between the two embodiments is the support 5, and the specific difference between the two embodiments is disclosed as follows.

The supporting layer 51 is disposed on a part of the upper surface 11 of the substrate 1 and arranged between the sensor chip 2 and the solder pads 111. The height H51' from the upper surface 11 of the substrate 1 to the top of the supporting layer 51 is larger than the height H21 from the upper surface 11 of the substrate 1 to the top surface 21 of the sensor chip 2. Accordingly, a part of each of the wires 3 is embedded in the supporting layer 51. Moreover, the supporting layer 51 includes an extending portion 512 disposed on the top surface 21 of the sensor chip 2 and arranged outside the connecting pads 213.

The combining layer 52 is arranged between the supporting layer 51 and the supporting region 422 of the transparent layer 4. The combining layer 52 preferably does not contact with the upper surface 11 of the substrate 1, any of the solder pads 111, the connecting pads 213 or the wires 3. The thickness of the combining layer 52 in the present embodiment is smaller than that of the supporting layer 51, but the present disclosure is not limited thereto.

The packaging compound 6 includes a molding compound 61 and a liquid compound 62. The molding compound 61 is disposed on the upper surface 11 of the substrate 1 and covers the side edge 511 of the supporting layer 51. The top side of the molding compound 61 is preferably flush with that of the supporting layer 51. The liquid compound 62 is disposed on the molding compound 61 and covers the side edge 521 of the combining layer 52, the fixing region 423, and the side edge 43 of the transparent layer 4.

The descriptions illustrated supra set forth simply the preferred embodiments of the present disclosure; however, the characteristics of the present disclosure are by no means restricted thereto. All changes, alterations, or modifications conveniently considered by those skilled in the art are deemed to be encompassed within the scope of the present disclosure delineated by the following claims.

What is claimed is:

1. A sensor package structure, comprising:
   a substrate having an upper surface and a lower surface opposing to the upper surface, wherein the substrate includes a plurality of solder pads arranged on the upper surface;
   a sensor chip having a top surface and a bottom surface opposing to the top surface, wherein the bottom surface of the sensor chip is disposed directly on the upper surface of the substrate and surrounded by the solder pads, and the sensor chip includes a plurality of connecting pads arranged on the top surface;
   a plurality of wires, wherein one end of the wires are respectively connected to the solder pads, and the other end of the wires are respectively connected to the connecting pads;
   a transparent layer having a first surface and a second surface opposing to the first surface, wherein the second surface has a central region facing the sensor chip and a ring-shaped supporting region enclosing the central region;
   a support disposed directly on the upper surface of the substrate and arranged outside the sensor chip, wherein a top side of the support abuts against the supporting region of the transparent layer, a part of each of the wires is embedded in the support, and a height from the upper surface of the substrate to the top side of the support is larger than a height from the upper surface of the substrate to a top of any of the wires, and wherein the support includes:
      a supporting layer disposed directly on the upper surface of the substrate; and
      a combining layer disposed directly on the supporting layer, wherein a top side of the combining layer abuts against the supporting region of the transparent layer; and
   a packaging compound disposed directly on the upper surface of the substrate and directly connected to a side edge of the support and a side edge of the transparent layer,
   wherein a height from the upper surface of the substrate to a top of the supporting layer is smaller than or equal to a height from the upper surface of the substrate to the top surface of the sensor chip, the part of each of the wires is embedded in the combining layer, and the supporting layer does not contact with any of the wires, and
   wherein the supporting layer is disposed on the upper surface of the substrate and arranged between the sensor chip and the solder pads.

2. The sensor package structure as claimed in claim 1, wherein the combining layer is disposed on the upper surface of the substrate, and the solder pads are embedded in the combining layer.

3. The sensor package structure as claimed in claim 2, wherein the combining layer includes:
   a first layer, being ring-shaped and disposed on the supporting layer and the upper surface of the substrate, the solder pads being embedded in the first layer, wherein a height from the upper surface of the substrate to the top of the first layer is larger than a height from the upper surface of the substrate to the top surface of the sensor chip; and a second layer being ring-shaped and disposed on the first layer, wherein a top side of the second layer abuts against the supporting region of the transparent layer.

4. The sensor package structure as claimed in claim 3, wherein the packaging compound includes:
   a molding compound disposed on the upper surface of the substrate and covering a side edge of the first layer; and
   a liquid compound disposed on the molding compound and covering a side edge of the second layer and the side edge of the transparent layer.

5. The sensor package structure as claimed in claim 1, wherein the top surface of the sensor chip has a sensing region and a ring-shaped wiring region arranged around the sensing region, an area of the sensing region substantially takes 60~95% of an area of the top surface, and the connecting pads are arranged on the wiring region.

6. The sensor package structure as claimed in claim 5, wherein the area of the sensing region substantially takes 80~90% of the area of the top surface.

7. The sensor package structure as claimed in claim 1, wherein the support has a ring shape and covers at least a part of a side edge of the sensor chip.

8. The sensor package structure as claimed in claim 1, wherein the support has a ring shape, and the support and a side edge of the sensor chip have a gap therebetween.

9. The sensor package structure as claimed in claim 1, wherein the support does not contact with the top surface of the sensor chip.

* * * * *